United States Patent [19]

Okatani et al.

[11] 4,157,455
[45] Jun. 5, 1979

[54] FM STEREOPHONIC RECEIVER HAVING MUTING AND MODE CHANGING

[75] Inventors: Masanao Okatani; Yoshiaki Ishibashi; Yoshiro Sugai, all of Kawagoe, Japan

[73] Assignee: Pioneer Electronic Corporation, Tokyo, Japan

[21] Appl. No.: 815,749

[22] Filed: Jul. 14, 1977

[30] Foreign Application Priority Data

Jul. 14, 1976 [JP] Japan .................................. 51/83717

[51] Int. Cl.² .............................................. H04H 5/00
[52] U.S. Cl. ............................................... 179/1 GM
[58] Field of Search ............. 179/15 BT, 1 G, 1 GQ, 179/100.1 TD, 100.4 ST

[56] References Cited

U.S. PATENT DOCUMENTS

| | | | |
|---|---|---|---|
| 3,569,633 | 3/1971 | Brahman | 179/15 BT |
| 3,752,934 | 8/1973 | Nakamura et al. | 179/15 BT |
| 3,919,482 | 11/1975 | Hamada | 179/15 BT |
| 3,934,087 | 1/1976 | Takahashi et al. | 179/15 BT |
| 3,999,132 | 12/1976 | Smith | 179/15 BT |
| 4,037,057 | 7/1977 | Ogita et al. | 179/15 BT |

Primary Examiner—Douglas W. Olms
Attorney, Agent, or Firm—Sughrue, Rothwell, Mion, Zinn and Macpeak

[57] ABSTRACT

An FM stereophonic receiver includes a muting circuit for interrupting or reducing its signal reproduction output according to the electric field strength and a mode changing circuit for changing its reproduction mode to a stereophonic reproduction mode or a monaural reproduction mode according to the electric field strength. In the receiver, manual switches are operated to switch the muting operation point of the muting circuit and the stereophonic and monaural change-over point of the mode changing circuit, whereby the signal reproduction conditions can be suitably selected according to the choice or wish of a user.

9 Claims, 2 Drawing Figures

FM STEREOPHONIC RECEIVER HAVING MUTING AND MODE CHANGING

BACKGROUND OF THE INVENTION

1. Field of the Invention

This invention relates to FM stereophonic receivers which comprise a muting circuit operating to interrupt or reduce its reproduction output according to an electric field strength, and a mode changing circuit operating to change its reproduction mode to a stereophonic reproduction mode or a monaural reproduction mode selectively according to the electric field strength, and more particularly to an FM stereophonic receiver in which the muting operation point of the muting circuit and the stereophonic and monaural change-over operation point of the mode changing circuit are switched, for instance, by one manual change-over switch.

2. Description of the Prior Art

As is well known in the art, the electric field strength of an FM broadcasting wave is greatly changed by the effects of buildings and geographical features lying in the course of the wave because the FM broadcasting wave is propagated more straightly than the AM broadcasting wave. Therefore, in the case when the FM broadcasting wave is received by a tuner installed in a vehicle, the reproduction of the FM broadcasting wave suffers from disadvantages such as occurrence of a so-called skip noise or is liable to be affected by multi-path. The FM broadcasting is excellent in high fidelity reproduction; however, as was described above, the FM broadcasting wave reproduction is liable to be affected by a variety of interferences or noises, and therefore it is necessary to provide countermeasures against the effects of such noises. One of the countermeasures considered is a method in which in the case where the electric field strength is sufficiently high (for instance, higher than 40 dB), the reproduction is effected in a stereophonic mode, and when the electric field strength is somewhat lowered, the stereophonic mode is automatically changed to a monaural mode, thereby to maintain the S/N ratio (the ratio of signal to noise) thereof at an allowable value. Furthermore, it is preferable that when the electric field strength is further lowered (for instance, lower than 20 dB) the signal reproduction is automatically suppressed or reduced.

The matters described above are applicable to the case where music is enjoyed through the reproduction of FM broadcasting waves. However, there may be persons who like to enjoy music in the stereophonic mode even if the S/N ratio is somewhat worse. In addition, in the case where the FM broadcasting service is utilized as an information source as in the case of listening to local traffic information or weather forecasts by the FM broadcasting, it is necessary to provide a means which, even if the S/N ratio is considerably lowered, operates not to intertupt the reproduction of audio signals.

SUMMARY OF THE INVENTION

Accordingly, an object of this invention is to provide an FM stereophonic receiver in which signal reproduction conditions can be suitably selected according to the choice or wish of a user.

The foregoing object and other objects of this invention have been achieved by the provision of an FM stereophonic receiver which comprises a muting circuit for interrupting or reducing a reproduction output thereof according to an electric field strength, and a mode changing circuit for changing signal reproduction mode to a stereophonic reproduction mode or a monaural reproduction mode selectively according to the electric field strength, and in which a muting operation point of the muting circuit and a stereophonic and monaural change-over operation point of the mode changing circuit are switched respectively by manual change-over switches.

The nature, principle, and utility of this invention will become more apparent from the following detailed description and the appended claims when read in conjunction with the accompanying drawing.

DETAILED DESCRIPTION OF THE INVENTION

Figure 1:
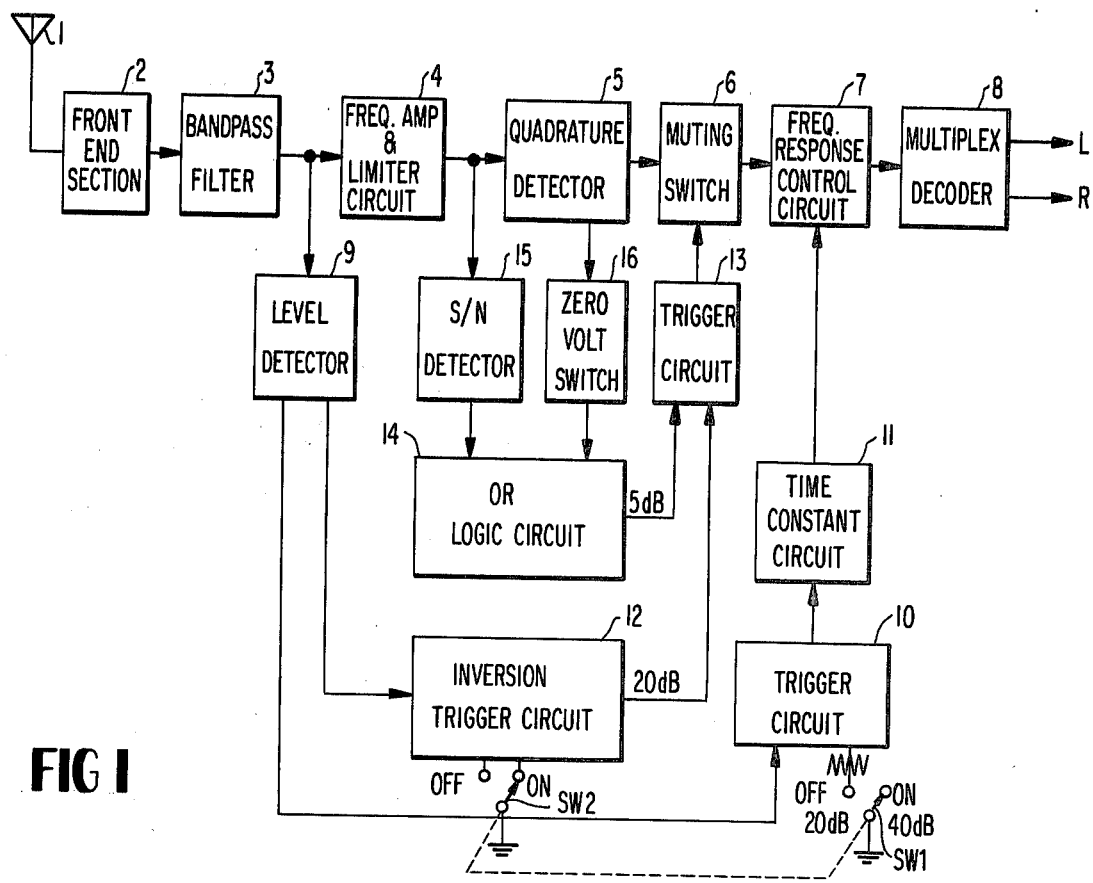
FIG. 1 is a block diagram showing one example of an FM stereophonic receiver according to this invention.

One preferred embodiment of an FM stereophonic receiver according to this invention is illustrated in FIG. 1, in which reference numeral 1 is intended to designate an antenna which receives an FM signal. The FM signal thus received is applied to a front end section 2 where it is tuned to a particular broadcast frequency which is in turn converted into an intermediate frequency signal (hereinafter referred to merely as "an IF signal" when applicable) of 10.7 MHz. This IF signal is applied to an intermediate frequency amplifier and limiter circuit 4 through a 10.7 MHz bandpass filter 3 and is further applied to a quadrature detector 5, by which the IF signal is demodulated into an audio signal. This audio signal thus obtained is applied through a muting switch 6 to a frequency response control circuit 7 where the high frequency characteristics thereof is adjusted and the audio signal thus treated is applied to a multiplex decoder 8. In this operation, when the electric field strength is reduced to a certain value, the above-described multiplex decoder 8 operates to cut off a treble compass higher than approximately 10 KHz thereby to reduce the noise component mixed in the treble compass. As a result, the S/N ratio of the audio signal is improved, and the level of the stereophonic pilot signal of 19 KHz is suitably lowered thereby to make the stereophonic decoding operating of the multiplex decoder 8 inoperable and to forcibly change the operation mode of the decoder to a monaural reproduction mode. That is, when the electric field strength is greater than a certain value, stereophonic audio signals are provided at the output terminals L and R of the multiplex decoder 8, and when the electric field strength is smaller than the certain value, monaural audio signals are provided at the output terminals L and R.

The above-described operation is controlled by a stereophonic and monaural mode switching circuit comprising a level detector 9, a trigger circuit 10, and a time constant circuit 11. More specifically, the level detector 9 receives the IF output of the 10.7 MHz bandpass filter 3, and subjects it to amplitude modulation (AM) detection. A part of the output of the level detector 9 is applied to the trigger circuit 10. The trigger circuit 10 is made up of, for instance, a Schmitt trigger circuit, and is provided with a manual switch $SW_1$ capable of controlling its threshold level (which is a voltage by which the circuit is rendered conductive (or ON)) in two steps. When the manual switch $SW_1$ is in ON state, or when the armature of the switch is tripped to its ON terminal, the threshold level of the trigger circuit 10 is set at a relatively high level; while when the armature of the switch $SW_1$ is tripped to its OFF terminal, the threshold level of the trigger circuit 10 is set at a relatively low level. In other words, the trigger circuit 10 operates in such a manner that, with the switch $SW_1$ in the ON state, the output is obtained only when the electric field strength is higher than, for instance, 40 dB; and with the switch $SW_1$ in the OFF state, the output is obtained only when the electric field strength is higher than, for instance, 20 dB. The output of the trigger circuit 10 is applied through the time constant circuit 11 to the frequency response control circuit 7, whereby the characteristics of the control circuit is maintained in the whole-band-pass state thereby to provide stereophonic signals at the output terminals L and R of the multiplex decoder 8. On the other hand, when the electric field strength becomes lower than 40 dB, the output of the trigger circuit 10 is zeroed, and accordingly the voltage applied to the frequency response control circuit 7 is also zeroed. As a result, owing to the characteristics of the control circuit 7 the treble compass higher than 10 KHz is cut off, and the mode is changed from the stereophonic receiving mode to the monaural receiving mode, thereby to prevent the lowering of the S/N ratio.

In the case when the armature of the manual switch $SW_1$ of the trigger circuit 10 is tripped over to the OFF position, the same operation as that described above takes place. However, it should be noted that the reproduction mode changing point between the stereophonic reproduction mode and the monaural reproduction mode is shifted to 20 dB from 40 dB. In this connection, it is expected that if the electric field strength varies higher or lower around the streophonic and monaural reproduction mode changing point, the treble cut-off characteristics vary frequently while the stereophonic and monaural reproduction modes are switched over to each other frequently. Therefore, in order to prevent the occurrence of such undesirable conditions as described above, the above-described time constant circuit 11 is so designed that the attack time is short but the recovery time is long so that the treble cut-off operation is forcibly effected, or the circuit is held in the monaural mode, for a certain period of time.

A part of the output of the above-described level detector 9 is applied to an inversion trigger circuit 12, which is provided with a manual switch $SW_2$ adapted to change the threshold level thereof in two steps. With the manual switch $SW_2$ in the ON state as shown in FIG. 1, when the trigger circuit 12 receives an input corresponding to an electric field strength higher than 20 dB, its output is interrupted; however, when the input applied to the trigger circuit corresponds to an electric field strength lower than 20 dB, the trigger circuit is energized, and the output thereof is applied to one of the two input terminals of a trigger circuit 13. When the armature of the manual switch $SW_2$ is tripped over to the OFF position, the output of the trigger circuit 12 is grounded. Accordingly, the output of the trigger circuit 12 is interrupted irrespective of the value of the electric field strength. The output of an OR logic circuit 14 is applied to the other input terminal of the trigger circuit 13. Applied to the OR logic circuit 14 are the output of an S/N detector 15 and the output of a zero volt switch 16. The S/N detector 15 operates to provide S/N information on the basis of the output of the limiter circuit. The zero volt switch 16 receives the DC output (being a so-called "S curve voltage") of the quadrature detector 5 as its input and subjects the input to full-wave rectification substantially. The OR logic circuit 14 is so designed that when it receives an input corresponding to an electric field strength higher than 5 dB, its output is interrupted; however, when it receives an input corresponding to an electric field strength lower than 5 dB, it is energized so as to apply its output to the other input terminal of the above-described trigger circuit 13.

In other words, in the case when the switch $SW_2$ of the inversion trigger circuit 12 is in the ON state, and the electric field strength is higher than 20 dB, no outputs are applied to the two input terminals of the trigger circuit 13 and the muting switch 6 is maintained in the OFF state. Accordingly, in this case, the audio signal from the quadrature detector 5 passes through the muting switch 6 as it is, and is introduced to the frequency response control circuit 7. In the case when the electric field strength becomes lower than 20 dB the inversion trigger circuit 12 produces its output and the muting switch 6 is rendered conductive (ON), as a result of which the passage of the audio signal is interrupted. Furthermore, in the case when the manual switch $SW_2$ is set in the OFF state, only when the OR logic circuit produces the output; that is, only when the electric field strength becomes lower than 5 dB, the muting switch 6 is rendered conductive, and similarly as in the above-described case the audio signal is interrupted thereby.

Figure 2:
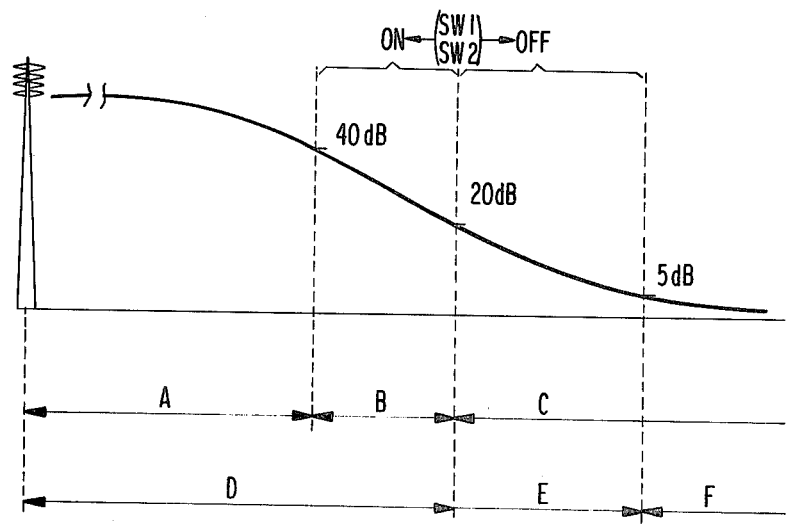
FIG. 2 is a graphical representation for a description of the signal reception and reproduction of the FM stereophonic receiver according to the invention.

The above-described manual switches $SW_1$ and $SW_2$ are gang-switches as indicated in FIG. 1. If the armatures of the switches are tripped to the ON and OFF positions, a broadcast signal receiving mode as shown in FIG. 2 can be obtained. When the armatures of the switches $SW_1$ and $SW_2$ are at the ON positions, if the electric field strength is much higher than 40 dB, the signal is received and reproduced in a high fidelity stereophonic mode, and accordingly, for instance, music can be reproduced with high tonal quality without noises (Area A). In the case when the electric field strength is between 40 dB and 20 dB, the signal reproduction mode is forcibly set to the monaural reproduction mode, and therefore the signal reception and reproduction are effected without significant noises (Area B). In the case when the electric field strength is lower than 20 dB, the muting switch is rendered conductive, and therefore signals mixed with noises which may give an unpleasant feeling in music are forcibly blocked (Area C).

Thus, in the case where the armatures of the manual switches $SW_1$ and $SW_2$ are tripped over to the ON position, only when the electric field strength is of a value with which the features of FM broadcasting can be fully utilized, the operation is effected with high fidelity to satisfactorily use the FM broadcasting feature, that is, an FM broadcast can be employed as a musical source with high fidelity.

Now, the case where the armatures of the switches $SW_1$ and $SW_2$ are tripped over to the OFF positions, respectively, will be described. In this case, if the electric field strength is higher than 20, the signal reception and reproduction are effected in the stereophonic mode (Area D); if the electric field strength is between 20 dB and 5 dB, the monaural reproduction mode is provided so that although the reproduced signal may be mixed with noises to a certain extent, the receiver operates, under its minimum allowable conditions, to receive and reproduce information such as local traffic information and weather forecasts (Area E); and if the electric field strength is lower than 5 dB as is found in the inside of a tunnel or in the case when inter-station noises occur during selecting a station, or a broadcast, the received signal is blocked (Area F). As is apparent from the above description, in the case where the armatures of the manual switches SW$_1$ and SW$_2$ are tripped to the OFF positions, respectively, the receiver according to this invention can utilize FM broadcasting as if it is an information source even if the environmental conditions are such that noises are mixed into the receiving signal.

Accordingly, the FM stereophonic receiver according to this invention is capable of selecting different signal reproduction modes according to the choice or wish of a user, and can achieve the objects of the invention described in the introductory part. If the FM stereophonic receiver is installed in an automobile especially, it will provide significant merits.

What is claimed is:

1. An FM stereophonic receiver having a front end producing an output IF signal, a detector responsive to said output IF signal and providing an output audio signal, and a multiplex decoder generating a stereophonic output audio signal when the level of said IF signal and a stereophonic pilot signal component of said audio signal are above predetermined levels and generating a monaural audio output signal when said IF signal and said stereophonic pilot signal component are below said predetermined levels, the improvement comprising:
   (a) muting circuit means for coupling said output audio signal to an output only when the level of said audio IF signal is greater than or equal to a fixed muting operation point; and
   (b) mode changing circuit means responsive to said output of said muting circuit for providing a stereophonic output audio signal when the level of said output IF signal is above a fixed stereophonic and monaural changeover point and for providing a monaural output audio signal when the level of said output IF signal is less than said stereophonic and monaural changeover point, said mode changing circuit having a time constant circuit means with a fast attack time and a slow recovery time.

2. An FM stereophonic receiver as claimed in claim 1, wherein said mode changing circuit means comprises:
   (a) level detector means responsive to said front end for providing amplitude modulation detection of said output IF signal to a first and a second output;
   (b) trigger circuit means for providing a high state output signal when the signal at said first output of said level detector means exceeds said fixed stereophonic and monaural changeover point;
   (c) time constant circuit means for providing a high state output signal when said output signal from said trigger circuit means is in the high state; and
   (d) frequency response control circuit means for passing said output audio signal with said sterophonic pilot signal above said predetermined level to said multiplex decoder when said output signal from said time constant circuit means is in the high state, and for passing said audio signal without said stereophonic pilot signal to said input of said multiplex decoder when said output signal from said time constant circuit means is in the low state.

3. An FM stereophonic receiver as claimed in claim 2, wherein said time constant circuit means has a fast attack time when going to the low state and a slow recovery time when going to the high state.

4. An FM stereophonic receiver as claimed in claim 2, wherein said muting circuit means comprises:
   (a) inversion trigger circuit means for providing a high state output signal when the signal at said second output of said level detector means is less than a first value of said fixed muting operation point;
   (b) trigger circuit OR means for producing a high state output signal except when the output signal from said inversion trigger circuit means is in the low state; and
   (c) muting switch means responsive to a quadrature detector for providing said output audio signal to said frequency response control circuit means when said output signal from said trigger circuit means is in the low state.

5. An FM stereophonic receiver as claimed in claim 4, wherein said muting circuit means further comprises:
   (a) S/N detector means for providing an output signal when the level of said output IF signal is less than a second value of said fixed muting operation point;
   (b) zero volt switch means for providing an output signal when the S curve value of said quadrature detector is less than said second value of said fixed muting operation point; and
   (c) OR logic means for providing a high state output signal except when said output signal from said S/N detector means and said output signal from said zero volt switch means are both zero.

6. An FM stereophonic receiver as claimed in claim 5, wherein said trigger circuit OR means produces a high state output signal except when the output signal from said inversion trigger circuit means and the output signal from said OR logic circuit means are both in the low state.

7. An FM stereophonic receiver as claimed in claim 6, wherein the value of said fixed muting operation point and the value of said fixed stereophonic and monaural changeover point can be manually changed between a first set of values to a second set of values in a ganged fashion.

8. An FM stereophonic receiver as claimed in claim 6, wherein the first set of values of said fixed muting operation point and said first fixed stereophonic and manual changeover point are at electric field strengths of 20 dB and 40 dB respectively, and the second set of values of said fixed muting operation point and said fixed stereophonic and manual changeover point are 5 dB and 20 dB, respectively.

9. An FM stereophonic receiver having a front end producing an output IF signal, a detector responsive to said output IF signal and providing an output audio signal, and a multiplex decoder generating a stereophonic output audio signal when the level of said IF signal and a stereophonic pilot signal component of said audio signal are above predetermined levels and generating a monaural audio output signal when said IF signal and said stereophonic pilot signal component are below said predetermined levels, the improvement comprising:
   (a) muting circuit means for coupling said output audio signal to an output only when the level of said audio IF signal is greater than or equal to a fixed muting operation point; and (b) mode changing circuit means responsive to said output of said muting circuit for providing a stereophonic output audio signal when the level of said output IF signal is above a fixed stereophonic and monaural changeover point and for providing a monaural output audio signal when the level of said output IF signal is less than said stereophonic and monaural changeover point, wherein the value of said fixed muting operation point and the value of said fixed stereophonic and monaural changeover point can be manually changed beween two sets of values in a ganged fashion and wherein the first set of values of said fixed muting operation point and said fixed stereophonic and monaural changeover point are at electric field strengths of 20 dB and 40 dB respectively, and the second set of values of said fixed muting operation point and said fixed stereophonic and monaural chanegover point are 5 dB and 20 dB respectively.

* * * * *